US012113433B2

(12) United States Patent
Michener et al.

(10) Patent No.: US 12,113,433 B2
(45) Date of Patent: Oct. 8, 2024

(54) SYSTEM AND METHOD FOR DETECTING IGBT FAILURE IN A MULTI-LEVEL CONVERTER USING GATE-EMITTER VOLTAGE SENSING

(71) Applicant: General Electric Company, Schenectady, NY (US)

(72) Inventors: Nathaniel Robert Michener, Roanoke, VA (US); Robert Gregory Wagoner, Roanoke, VA (US)

(73) Assignee: GE Infrastructure Technology LLC, Greenville, SC (US)

( * ) Notice: Subject to any disclaimer, the term of this patent is extended or adjusted under 35 U.S.C. 154(b) by 232 days.

(21) Appl. No.: 17/725,683

(22) Filed: Apr. 21, 2022

(65) Prior Publication Data

US 2023/0344332 A1 Oct. 26, 2023

(51) Int. Cl.
*H02M 1/32* (2007.01)
*H02J 3/00* (2006.01)
*H02M 1/084* (2006.01)
*H02M 5/458* (2006.01)

(52) U.S. Cl.
CPC ............. *H02M 1/32* (2013.01); *H02J 3/0012* (2020.01); *H02M 1/084* (2013.01); *H02M 5/4585* (2013.01)

(58) Field of Classification Search
CPC ................................ H02M 7/487; H02M 1/32
See application file for complete search history.

(56) References Cited

U.S. PATENT DOCUMENTS

| 8,207,736 | B2 | 6/2012 | Chu et al. |
| 8,310,796 | B2 | 11/2012 | Wagoner |
| 8,471,584 | B2 | 6/2013 | Soldi et al. |
| 8,472,153 | B1 | 6/2013 | Grbovic |
| 8,503,146 | B1 | 8/2013 | Shekhawat |
| 9,048,831 | B2 | 6/2015 | Wagoner et al. |

(Continued)

FOREIGN PATENT DOCUMENTS

| CN | 103378759 B | 4/2017 |
| CN | 113433377 A | 9/2021 |

(Continued)

OTHER PUBLICATIONS

EPO Search Report, Aug. 28, 2023.

(Continued)

*Primary Examiner* — Rafael O De Leon Domenech
(74) *Attorney, Agent, or Firm* — Dority & Manning, P.A.

(57) ABSTRACT

A method for operating a multi-level bridge power converter of an electrical power system connected to a power grid includes receiving a commanded state for one or more switching devices thereof. The method also includes receiving a gate-emitter voltage of one or more of the switching devices. Further, the method includes comparing, via at least one comparator, the gate-emitter voltage of the one or more switching devices to a reference voltage range corresponding to the commanded state of the one or more switching devices. In addition, the method includes determining an actual state of the one or more switching devices based on the comparison. Thus, the method also includes implementing a control action based on the actual state of the one or more switching devices.

20 Claims, 7 Drawing Sheets

(56) References Cited

U.S. PATENT DOCUMENTS

| | | | |
|---|---|---|---|
| 9,184,650 | B2 | 11/2015 | Shepard et al. |
| 9,362,859 | B2 | 6/2016 | Wagoner et al. |
| 9,444,448 | B2 | 9/2016 | Wagoner et al. |
| 9,496,864 | B2 | 11/2016 | Wagoner et al. |
| 9,748,947 | B1 | 8/2017 | Wagoner et al. |
| 10,063,161 | B2 | 8/2018 | Li et al. |
| 10,355,618 | B2 | 7/2019 | Zhuang et al. |
| 10,356,228 | B2 | 7/2019 | Shepard et al. |
| 2011/0140727 | A1* | 6/2011 | Soldi ............... H03K 17/18 |
| | | | 324/762.01 |
| 2016/0352251 | A1 | 12/2016 | Li et al. |
| 2020/0212906 | A1 | 7/2020 | Mukunoki et al. |

FOREIGN PATENT DOCUMENTS

| | | |
|---|---|---|
| EP | 2546983 A1 | 1/2013 |
| EP | 2854276 A2 | 4/2015 |
| EP | 2884664 A1 | 6/2015 |
| EP | 3 076 549 A1 | 10/2016 |
| EP | 3270512 A1 | 1/2018 |
| EP | 3 846 333 A1 | 7/2021 |
| JP | 6300964 B1 | 3/2018 |

OTHER PUBLICATIONS

Fazio et al., Fault Detection and Reconfiguration Strategy for ANPC Converters, 2012 15$^{th}$ International Power Electronics and Motion Control Conference (EPE/PEMC) Sep. 4-6, 2012, IEEE, Novi Sad, Serbia. Abstract Only.

* cited by examiner

SYSTEM AND METHOD FOR DETECTING IGBT FAILURE IN A MULTI-LEVEL CONVERTER USING GATE-EMITTER VOLTAGE SENSING

FIELD

The present disclosure relates generally to electrical power systems, and more particularly to a system and method for detecting IGBT failure in a multi-level power converter in an electrical power system using gate-emitter voltage sensing.

BACKGROUND

Wind turbines have received increased attention as a renewable energy source. Wind turbines use the wind to generate electricity. The wind turns multiple blades connected to a rotor that is coupled to a generator for generation of electricity. Certain wind turbines include a doubly-fed induction generator (DFIG) to convert wind energy into electrical power suitable for output to an electrical grid. DFIGs are typically connected to a converter that regulates the flow of electrical power between the DFIG and the grid. More particularly, the converter allows the wind turbine to output electrical power at the grid frequency regardless of the rotational speed of the wind turbine blades.

A typical DFIG system includes a wind driven DFIG having a rotor and a stator. The stator of the DFIG is coupled to the electrical grid through a stator bus. A power converter is used to couple the rotor of the DFIG to the electrical grid. The power converter can be a two-stage power converter including both a rotor side converter and a line side converter. The rotor side converter can receive alternating current (AC) power from the rotor via a rotor bus and can convert the AC power to a DC power. The line side converter can then convert the DC power to AC power having a suitable output frequency, such as the grid frequency. The AC power is provided to the electrical grid via a line bus. An auxiliary power feed can be coupled to the line bus to provide power for components used in the wind turbine system, such as fans, pumps, motors, and other components of the wind turbine system.

Multi-level converters (such as neutral point clamped converters and active neutral point clamped converters) are generally used in high power industrial applications such as variable speed drive (VSD) systems or in energy conversion applications such as a solar (or photovoltaic) power generation systems, wind turbine generators or marine and hydrokinetic power generation systems. The general function of the multi-level converter is to synthesize a sinusoidal voltage by several levels of voltages, typically obtained from capacitor voltage sources. A three-level converter includes two capacitor voltages in series with the center tap as the neutral. Each phase leg of the three-level converter has two pairs of switching devices in series. The switching device is bidirectional in current, often realized as anti-parallel connection of a unidirectional electronic switching device (e.g., IGBT, IGCT) and a diode (free-wheeling diode).

Occasionally (and for various reasons), the switching devices in a multi-level converter fail in a short-circuit condition. For example, if there is large power loss within the switching device due to electrical stress or overcurrent, the switching device overheats, which may lead to thermal breakdown of the switching device. Similarly, when an inductive load or inductive current is switched off, the switching device may experience an overvoltage that results in voltage breakdown of the switching device. Once a switching device is broken down or destroyed due to overheating or overvoltage, protective measures should be quickly taken to prevent a chain reaction that could result in destruction of the entire multi-level converter bridge.

In particular, a three-level active neutral point (ANPC) converter suffers from cascading failure modes when one of its IGBTs fails and goes undetected. This can include damage to the entire bridge beyond the single phase leg with the failed device, resulting in very expensive repairs. In order to limit damage, a failed IGBT must be detected very quickly, and the power converter must shut down safely in response in order to limit damage to a single phase leg. Furthermore, such detection must happen very fast (measured in microseconds) to limit the failure propagation.

Accordingly, it is important to provide protection against a catastrophic failure of a multi-level converter due to failure of one of the switching devices (such as an IGBT failure in the multi-level power converter. Thus, the present disclosure is directed to a system and method for detecting IGBT failure in a multi-level power converter in an electrical power system using gate-emitter voltage sensing. In particular, the present disclosure uses multiple comparators to compare an actual state of an IGBT gate against its commanded state.

BRIEF DESCRIPTION

Aspects and advantages of the disclosure will be set forth in part in the following description, or may be obvious from the description, or may be learned through practice of the disclosure.

In one aspect, the present disclosure is directed to a computer-implemented method for operating a multi-level bridge power converter of an electrical power system connected to a power grid. The multi-level power converter has a first converter coupled to a DC link. The multi-level power converter has a plurality of switching devices. The method includes receiving, via a controller, a commanded state for one or more of the plurality of switching devices. The method also includes receiving, via the controller, a gate-emitter voltage of the one or more of the plurality of switching devices. Further, the method includes comparing, via at least one comparator of the controller, the gate-emitter voltage of the one or more plurality of switching devices to a reference voltage range corresponding to the commanded state from the one or more of the plurality of switching devices. In addition, the method includes determining, via the controller, an actual state of the one or more of the plurality of switching devices based on the comparison. Thus, the method also includes implementing, via the controller, a control action based on the actual state of the one or more of the plurality of switching devices.

In another aspect, the present disclosure is directed to a multi-level bridge power converter with a plurality of phase legs. The multi-level bridge power converter includes a first converter and a second converter coupled together via a DC link. Each of the first and second converters includes a plurality of switching devices and a controller configured to operate the first and second converters. The controller includes at least one processor configured to perform a plurality of operations, including but not limited to receiving a commanded state for one or more of the plurality of switching devices, receiving a gate-emitter voltage of the one or more of the plurality of switching devices, comparing, via at least one comparator of the controller, the gate-emitter voltage of the one or more plurality of switching devices to a reference voltage range corresponding to the commanded state from the one or more of the plurality of switching devices, determining an actual state of the one or more of the plurality of switching devices based on the comparison, and implementing a control action based on the actual state of the one or more of the plurality of switching devices. It should be further understood that the multi-level bridge power converter may also include any of the additional features described herein.

These and other features, aspects and advantages of the present disclosure will become better understood with reference to the following description and appended claims. The accompanying drawings, which are incorporated in and constitute a part of this specification, illustrate embodiments of the disclosure and, together with the description, serve to explain the principles of the disclosure.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

DETAILED DESCRIPTION

Reference now will be made in detail to embodiments of the disclosure, one or more examples of which are illustrated in the drawings. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part of an embodiment can be used with another embodiment to yield a still further embodiment. Thus, it is intended that the present disclosure covers such modifications and variations as come within the scope of the appended claims and their equivalents.

A three-level active neutral point (ANPC) converter suffers from cascading failure modes when an IGBT switch fails in it and goes undetected. This can include damage to the entire bridge beyond the single-phase leg with the failed device, resulting in very expensive repairs. In order to limit damage, a failed IGBT must be detected very quickly, and the power converter must shut down safely in response in order to limit damage to a single-phase leg. This detection must happen very fast (measured in microseconds) to limit the failure propagation. Thus, the present disclosure uses multiple comparators to compare an IGBT gate's actual state against its commanded state. The level comparator approach allows the feedback to be extremely fast. Using multiple comparators allows us to determine whether the IGBT is in an on state, an off state, or a shorted or faulty state.

Figure 1:
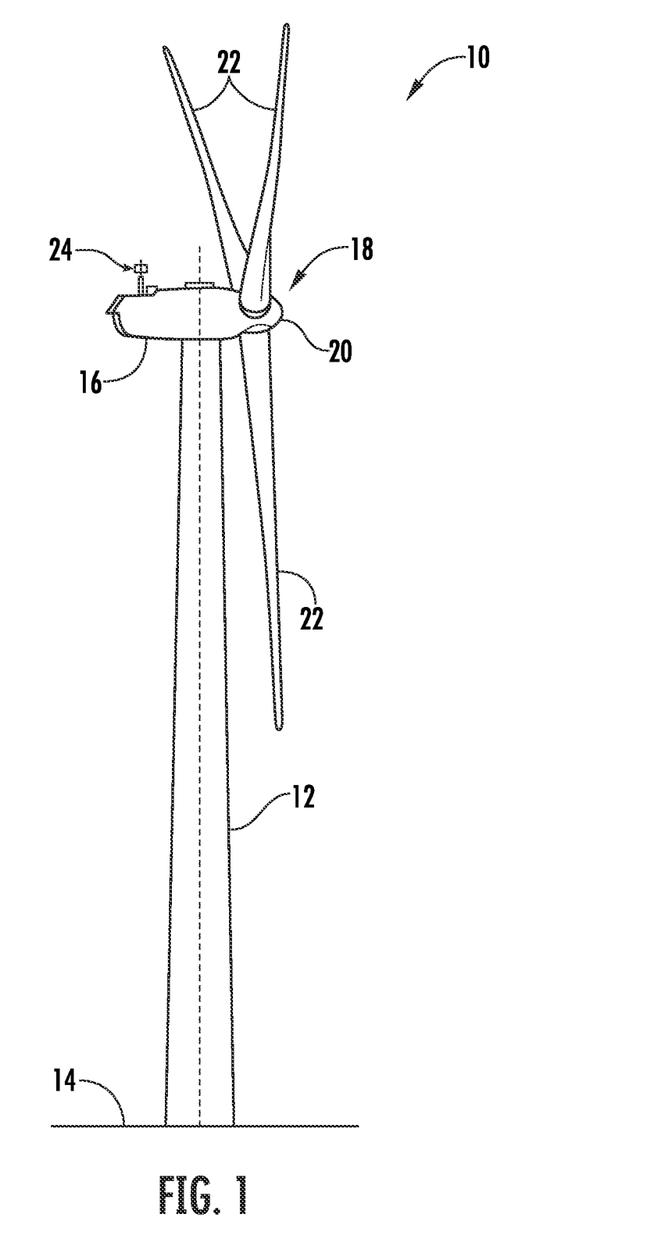
FIG. 1 illustrates a perspective view of an embodiment of a wind turbine according to the present disclosure.

Referring now to the drawings, FIG. 1 illustrates a perspective view of an embodiment of a wind turbine 10 according to the present disclosure. As shown, the wind turbine 10 generally includes a tower 12 extending from a support surface 14, a nacelle 16 mounted on the tower 12, and a rotor 18 coupled to the nacelle 16. The rotor 18 includes a rotatable hub 20 and at least one rotor blade 22 coupled to and extending outwardly from the hub 20. For example, in the illustrated embodiment, the rotor 18 includes three rotor blades 22. However, in an alternative embodiment, the rotor 18 may include more or less than three rotor blades 22. Each rotor blade 22 may be spaced about the hub 20 to facilitate rotating the rotor 18 to enable kinetic energy to be transferred from the wind into usable mechanical energy, and subsequently, electrical energy. For instance, as will be described below, the rotor 18 may be rotatably coupled to an electric generator 120 (FIG. 2) for production of electrical energy. One or more wind conditions, such as wind speed and/or wind direction may also be monitored via a wind sensor 24, such as an anemometer, located on the nacelle 16 or any other suitable location near the wind turbine 10.

Figure 2:
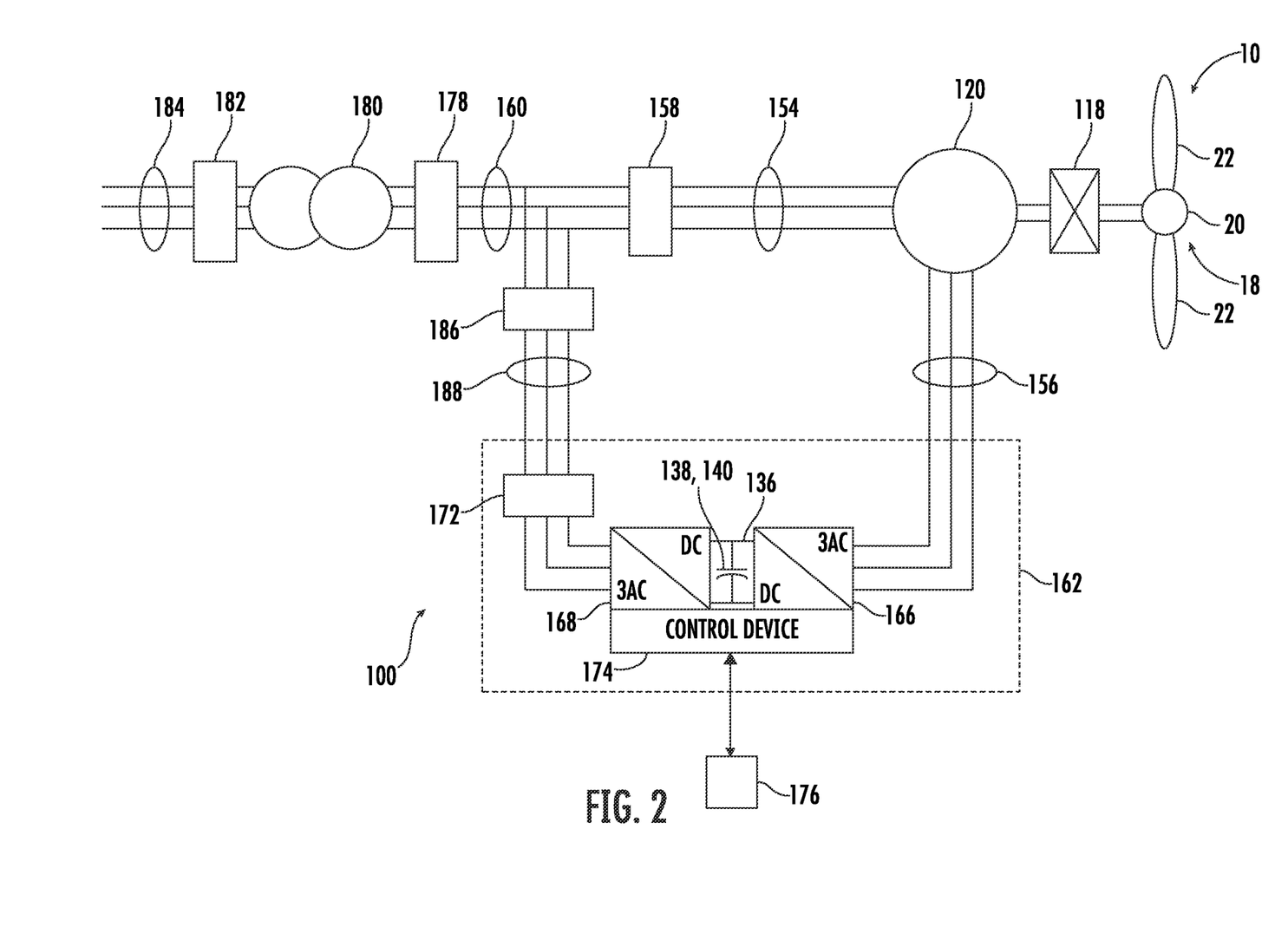
FIG. 2 illustrates a schematic diagram of an embodiment of a DFIG wind turbine system according to the present disclosure.

Referring now to FIG. 2, a schematic diagram of an embodiment of a wind turbine power system 100 ("wind turbine system") is illustrated in accordance with aspects of the present disclosure. Although the present disclosure will generally be described herein with reference to the system 100 shown in FIG. 2, those of ordinary skill in the art, using the disclosures provided herein, should understand that aspects of the present disclosure may also be applicable in other power generation systems, and, as mentioned above, that the present disclosure is not limited to wind turbine systems.

Figure 3:
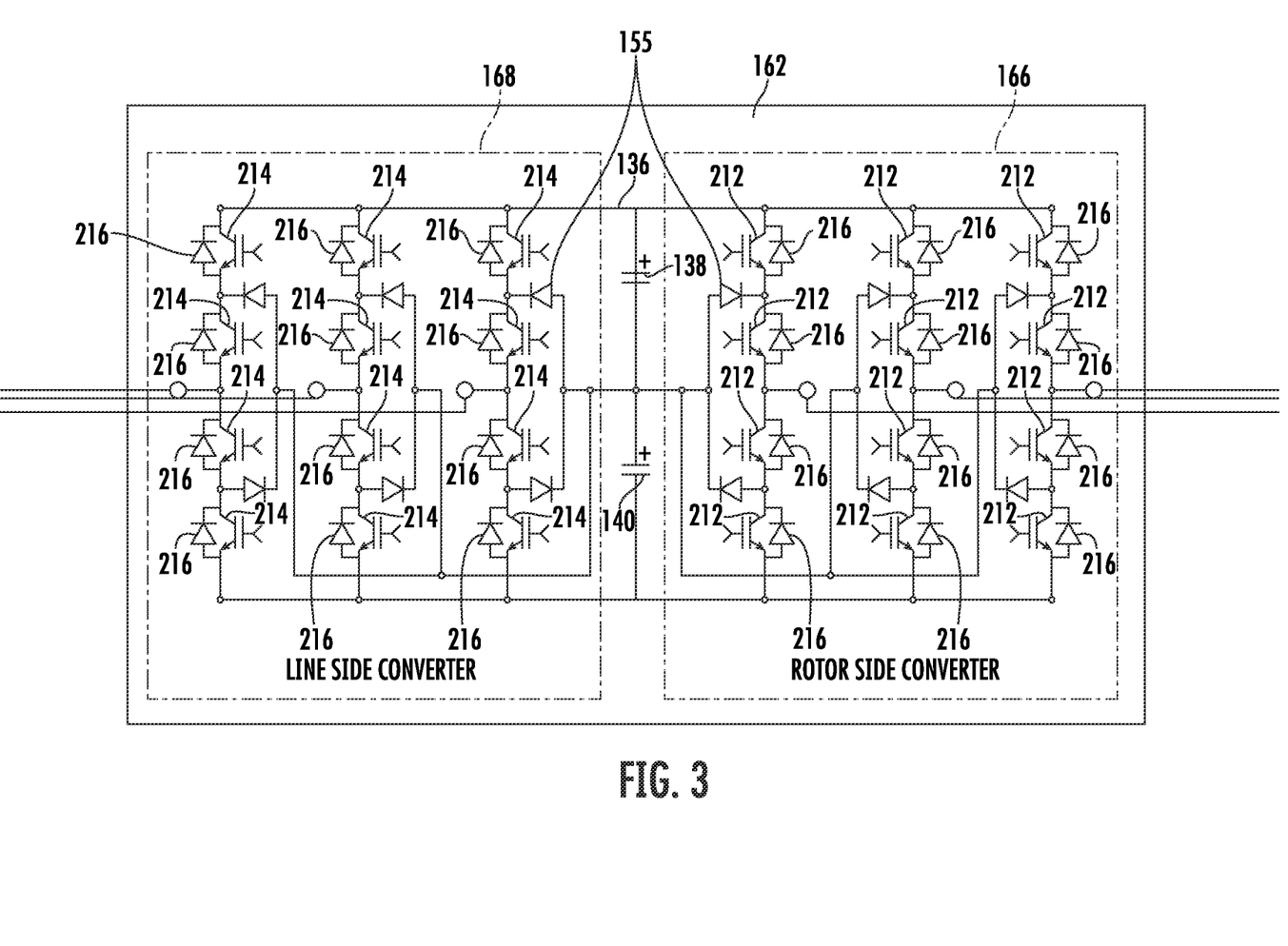
FIG. 3 illustrates a schematic diagram of an embodiment of a three-level voltage-source power converter of a wind turbine according to the present disclosure.

In the embodiment of FIG. 2, the rotor 18 of the wind turbine 10 (FIG. 1) may, optionally, be coupled to a gearbox 118, which is, in turn, coupled to a generator 120, which may be a doubly fed induction generator (DFIG). As shown, the DFIG 120 may be connected to a stator bus 154. Further, as shown, a power converter 162 may be connected to the DFIG 120 via a rotor bus 156, and to the stator bus 154 via a line side bus 188. As such, the stator bus 154 may provide an output multiphase power (e.g., three-phase power) from a stator of the DFIG 120, and the rotor bus 156 may provide an output multiphase power (e.g., three-phase power) from a rotor of the DFIG 120. The power converter 162 may also include a rotor side converter (RSC) 166 and a line side converter (LSC) 168. The DFIG 120 is coupled via the rotor bus 156 to the RSC 166. Additionally, the RSC 166 is coupled to the LSC 168 via a DC link 136 across which is at least one DC link capacitor 138, 140. As shown in FIG. 3, the DC link 136 includes an upper capacitor 138 and a lower capacitor 140. The LSC 168 is, in turn, coupled to a line side bus 188.

The RSC 166 and the LSC 168 may be configured for normal operating mode in a three-phase, pulse width modulation (PWM) arrangement using insulated gate bipolar transistor (IGBT) switching elements, as will be discussed in more detail with respect to FIG. 3.

In addition, the power converter 162 may be coupled to a converter controller 174 in order to control the operation of the RSC 166 and/or the LSC 168 as described herein. It should be noted that the converter controller 174 may be configured as an interface between the power converter 162 and a local wind turbine control system 176 and may include any number of control devices. In an embodiment, the controller 174 may include a processing device (e.g., microprocessor, microcontroller, etc.) executing computer-readable instructions stored in a computer-readable medium. The instructions when executed by the processing device may cause the processing device to perform operations, including providing control commands (e.g., switching frequency commands) to the switching elements of the power converter 162. For an individual DFIG wind turbine power system 100, the reactive power may be supplied primarily by the RSC 166, via the generator 120 and the LSC 168.

In typical configurations, various line contactors and circuit breakers including, for example, a grid breaker 182 may also be included for isolating the various components as necessary for normal operation of the DFIG 120 during connection to and disconnection from a load, such as the electrical grid 184. For example, a system circuit breaker 178 may couple the system bus 160 to a transformer 180, which may be coupled to the electrical grid 184 via the grid breaker 182. In alternative embodiments, fuses may replace some or all of the circuit breakers.

In operation, alternating current power generated at the DFIG 120 by rotating the rotor 18 is provided to the electrical grid 184 via dual paths defined by the stator bus 154 and the rotor bus 156. On the rotor bus side 156, sinusoidal multi-phase (e.g., three-phase) alternating current (AC) power is provided to the power converter 162. The RSC 166 converts the AC power provided from the rotor bus 156 into direct current (DC) power and provides the DC power to the DC link 136. As is generally understood, switching elements (e.g., IGBTs) used in the bridge circuits of the RSC 166 may be modulated to convert the AC power provided from the rotor bus 156 into DC power suitable for the DC link 136.

In addition, the LSC 168 converts the DC power on the DC link 136 into AC output power suitable for the electrical grid 184. In particular, switching elements (e.g., IGBTs) used in bridge circuits of the LSC 168 can be modulated to convert the DC power on the DC link 136 into AC power on the line side bus 188. The AC power from the power converter 162 can be combined with the power from the stator of DFIG 120 to provide multi-phase power (e.g., three-phase power) having a frequency maintained substantially at the frequency of the electrical grid 184 (e.g., 50 Hz or 60 Hz).

Additionally, various circuit breakers and switches, such as grid breaker 182, system breaker 178, stator sync switch 158, converter breaker 186, and line contactor 172 may be included in the wind turbine power system 100 to connect or disconnect corresponding buses, for example, when current flow is excessive and may damage components of the wind turbine power system 100 or for other operational considerations. Additional protection components may also be included in the wind turbine power system 100.

Moreover, the power converter 162 may receive control signals from, for instance, the local control system 176 via the converter controller 174. The control signals may be based, among other things, on sensed states or operating characteristics of the wind turbine power system 100. Typically, the control signals provide for control of the operation of the power converter 162. For example, feedback in the form of a sensed speed of the DFIG 120 may be used to control the conversion of the output power from the rotor bus 156 to maintain a proper and balanced multi-phase (e.g., three-phase) power supply. Other feedback from other sensors may also be used by the controller 174 or control system 176 to control the power converter 162, including, for example, stator and rotor bus voltages and current feedbacks. Using the various forms of feedback information, switching control signals (e.g., gate timing commands for IGBTs), stator synchronizing control signals, and circuit breaker signals may be generated.

The power converter 162 also compensates or adjusts the frequency of the three-phase power from the rotor for changes, for example, in the wind speed at the hub 20 and the blades 22. Therefore, mechanical and electrical rotor frequencies are decoupled, and the electrical stator and rotor frequency matching is facilitated substantially independently of the mechanical rotor speed.

Under some states, the bi-directional characteristics of the power converter 162, and specifically, the bi-directional characteristics of the LSC 168 and RSC 166, facilitate feeding back at least some of the generated electrical power into generator rotor. More specifically, electrical power may be transmitted from the stator bus 154 to the line side bus 188 and subsequently through the line contactor 172 and into the power converter 162, specifically the LSC 168 which acts as a rectifier and rectifies the sinusoidal, three-phase AC power to DC power. The DC power is transmitted into the DC link 136. The capacitor 138 facilitates mitigating DC link voltage amplitude variations by facilitating mitigation of a DC ripple sometimes associated with three-phase AC rectification.

The DC power is subsequently transmitted to the RSC 166 that converts the DC electrical power to a three-phase, sinusoidal AC electrical power by adjusting voltages, currents, and frequencies. This conversion is monitored and controlled via the converter controller 174. The converted AC power is transmitted from the RSC 166 via the rotor bus 156 to the generator rotor. In this manner, generator reactive power control is facilitated by controlling rotor current and voltage.

Referring now to FIG. 3, a detailed, schematic diagram of an embodiment of the three-level neutral point clamped (NPC) voltage source power converter (i.e., a converter where output voltage has three possible values) shown in FIG. 2 is illustrated for sake of discussion and an understanding of the operating principles of the present disclosure. It should be understood that the present disclosure may also be applied to any other suitable multi-level power converter, such as an active neutral point clamped (ANPC) voltage source power converter, as well as any other multi-level power converters now known or later developed in the art.

As shown, the RSC 166 includes a plurality of bridge circuits and at least one clamping diode 155 with each phase of the rotor bus 156 input to the RSC 166 being coupled to a single bridge circuit. In addition, the LSC 168 may also include a plurality of bridge circuits and at least one clamping diode 155. Similar to the RSC 166, the LSC 168 also includes a single bridge circuit for each output phase of the LSC 168. In other embodiments, the LSC 168, the RSC 166, or both the LSC 168 and the RSC 166 may include parallel bridge circuits without deviating from the scope of the present disclosure.

Moreover, as shown, each bridge circuit may generally include a plurality of switching elements (e.g., such as insulated-gate bipolar transistors (IGBTs)) coupled in series with one another. For instance, as shown in FIG. 3, the plurality of switching devices of each bridge circuit may be arranged in a neutral point clamped (NPC) topology. As described herein, an NPC topology generally refers to a topology containing two series-connected high-side switches and two series-connected low-side switches. Often, IGBTs with anti-parallel diodes are used as the switches for an NPC converter, but other two-quadrant switch configurations can also be employed. In particular, as shown in FIG. 3, the RSC 166 may include a plurality of first IGBTs 212 and the LSC 168 may include a plurality of second IGBTs 214. In addition, as shown, a diode 216 may be coupled in parallel with each of the IGBTs 212, 214. As is generally understood, the LSC 168 and the RSC 166 may be controlled, for instance, by providing control commands, using a suitable driver circuit, to the gates of the IGBTs. For example, the converter controller 174 may provide suitable gate timing commands to the gates of the IGBTs of the bridge circuits. The control commands may control gate timing commands of the IGBTs to provide a desired output. It should be appreciated by those of ordinary skill in the art that, as an alternative to IGBTs, the power convertor 162 may include any other suitable switching elements.

Three-level neutral point clamped (NPC) converters must take less voltage stress because of the series connection arrangement compared to two-level converters. However, due to large commutation loops, inner switching devices of the power converter experience higher voltage spikes and demands to have snubbers in place. To avoid snubbers, active neutral point clamped (ANPC) converters with active clamped switches offer shorter commutation loops compared to NPC. Further, double dead time PWM techniques applied to ANPC offer lesser voltage stress on the inner switching devices. In line with ANPC converters, it is important to detect device failure quickly and assign a failure response mode instantly to protect the DC link and avoid chain reaction failure on other devices, and to provide for continued "fault tolerant" operation of the power converter.

Figure 4:
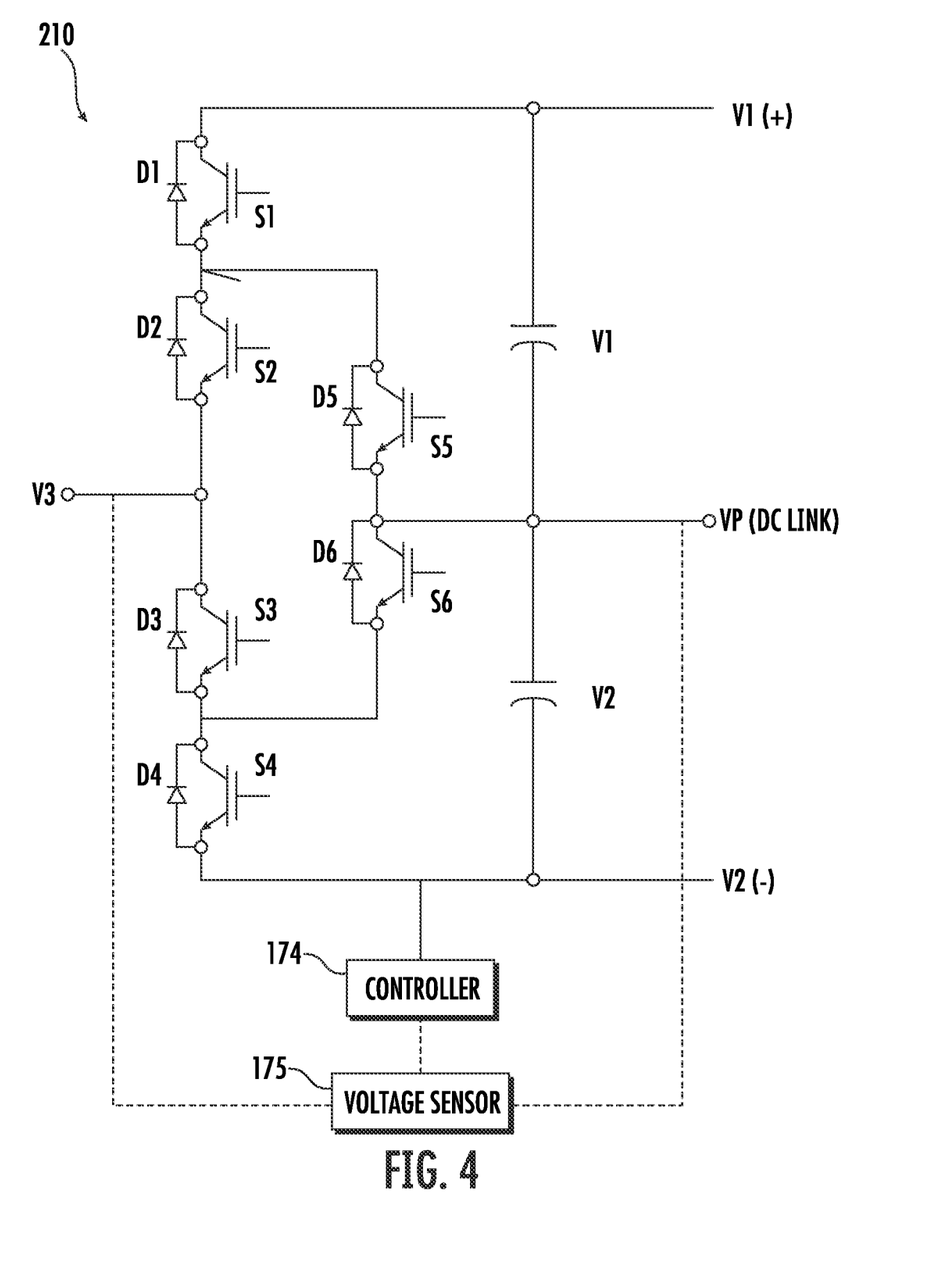
FIG. 4 illustrates a schematic diagram of an embodiment of a single-phase main circuit of a power converter according to the present disclosure.

Referring now to FIG. 4, a schematic diagram of a single-phase main circuit 210 of a switching branch of an ANPC power converter is illustrated in accordance with aspects of the present subject matter. The switching branch may be part of the RSC 166 or the LSC 168 in FIG. 3. Furthermore, as mentioned, the main circuit 210 has an active neutral point clamped (ANPC) topology, which generally refers to a topology having six diodes (e.g., D1 to D6) and six controllable semiconductor switches (e.g., S1 to S6). A power converter having one or more switching branches, like that of FIG. 4, may operate as a rectifier or as an inverter. In addition, it should be understood that each phase of the rotor bus 156 or the stator bus 188 may be coupled to a circuit with the same topology as the main circuit 210.

Still referring to FIG. 4, the plurality of the switching devices S1-S6 (e.g., IGBTs) are coupled together with a diode D1-D6 coupled in parallel with each of the IGBT switches. As shown, each leg of the power converter includes two outer switching devices S1, S4 and four inner switching devices S2, S3, S5, and S6. The LSC 168 and the RSC 166 are controlled, for instance, by providing control commands ("gate drive signals"), using a suitable driver circuit, to the gates of the IGBTs S1-S6. For example, in an embodiment, the controller 174 can provide suitable gate timing commands to the gates of the IGBTs to control the pulse width modulation of the IGBTs in order to produce a desired output. In an embodiment, the main circuit 210 may be controlled by the controller 174 according to a substantially non-interleaved switching pattern such that the switching elements of the main circuit 210 are switched in phase with one another. In other embodiments, the main circuit 210 may be controlled according to any other suitable switching pattern. It will be appreciated by those of ordinary skill in the art that other suitable switching elements can be used in place of IGBTs.

Input voltages V1 (e.g., positive voltage) and V2 (e.g., negative voltage) are controlled to each have a voltage equal to Vdc/2, where Vdc is the total DC link voltage. Voltage V3 is the phase A output voltage measured with respect to a center point of the DC link. The potential difference between the midpoint voltage VMID (referred to in FIG. 4 as VP) and V3 is the pole voltage of the controller. Switching device S1 is complementary to switching device S3 so that, when switching device S1 is gated on, switching device S3 is gated off and vice versa. Similarly, switching devices S2 and S4 are complementary.

In operation, each leg of the ANPC three-level converter has three switching stages. In the first switching stage, switching devices S1, S2 are turned on, S5 and S6 are turned off, and S3 and S4 are turned off. Assuming a stable operation, V1=V2=Vdc/2, and V3 becomes Vdc/2. In the second switching stage, switching devices S2, S3 are turned, S1 and S4 are turned off, and S5 and S6 are turned on. In this stage, V3 is equal to zero. In the third switching stage, switching devices S1, S2 are turned off, S5 and S6 are turned off, and S3 and S4 are turned on. This results in V3 becoming −Vdc/2. Thus, it can be seen that the phase voltage V3 has three levels Vdc/2, −Vdc/2 and 0. When all three legs of the ANPC three-phase converter are combined, then the resulting line to line voltages have five levels namely Vdc, Vdc/2, 0, −Vdc/2 and −Vdc. The three-level power converter of FIG. 3 may be increased to any level depending on the circuit topology and number of switching devices and diodes in the circuit. As the number of levels in the power converter increases, the output waveform of the converter approaches a pure sine wave, resulting in lower harmonics in the output voltage. In general, the number of switching stages can be higher than three as switching devices may not be gated on if the corresponding freewheeling diode is going to conduct current. This operation mode does not affect the number of levels of the output phase voltage.

In a three-level ANPC converter, a key failure mode exists when an inner switching device (e.g., S2, S3, S5, S6) fails short. Under this condition, one half of the DC link, V1 or V2 in FIG. 4, is charged to the peak line-to-line voltage of the machine or grid side voltage. When S1 fails, the inner switching device S2 is susceptible to full DC link voltage. These values are typically higher than the maximum allowed blocking voltage of the switching devices and the capacitors. In this case, other switching devices or clamping diodes may be stressed in terms of voltage or current beyond their capability. Hence, this will cause additional switching devices, in particular switching devices in phase legs connected to the same DC bus, to fail after the failure of the initial switching device.

Suitable logic circuits detect failures in the switching device and prevent secondary damage to the multi-level power converter. An example of a suitable failure-detection method is described, for example, in U.S. patent application Ser. No. 17/534,507 filed on Nov. 24, 2021. Thus, the present disclosure is directed to computer-implemented method 300 and system 400 for detecting failures in the switching device and preventing secondary damage to the multi-level power converter.

Figure 5:
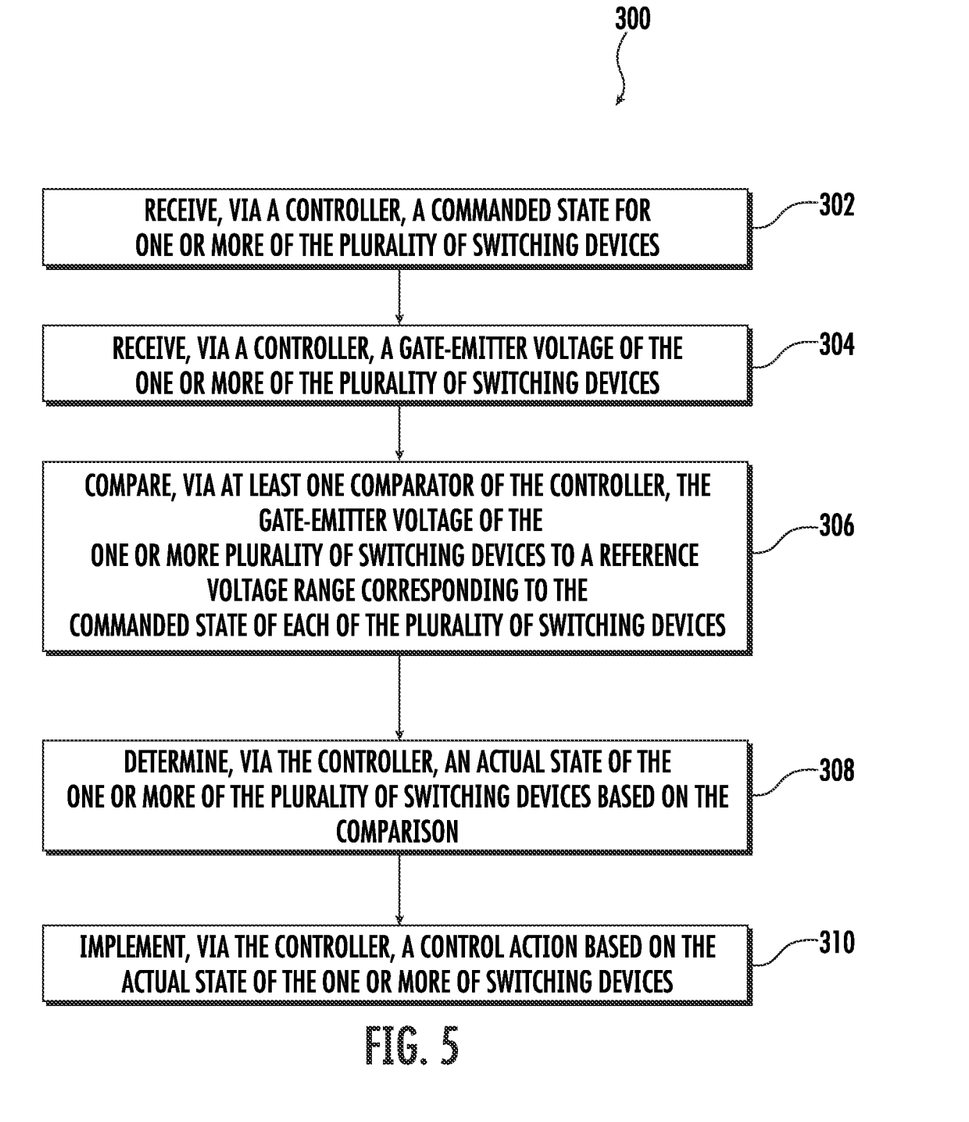
FIG. 5 illustrates a flow diagram of an embodiment of a method for operating a multi-level bridge power converter of an electrical power system connected to a power grid according to the present disclosure.

In particular, referring particularly in FIG. 5, as shown at (302), the method 300 includes receiving, via a controller, a commanded state for one or more of the plurality of switching devices. For example, in an embodiment, the commanded state refers to an ON state or an OFF state of one or more of the plurality of switching devices.

Figure 6:
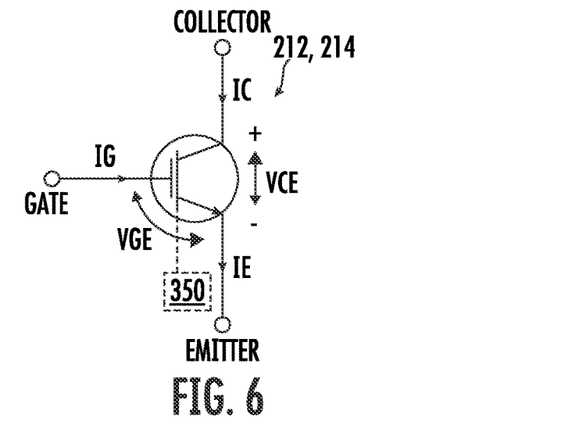
FIG. 6 illustrates a schematic diagram of an embodiment of an IGBT and its associated gate-emitter voltage $V_{GE}$ according to the present disclosure.

Further, as shown at (304), the method 300 includes receiving, via the controller, a gate-emitter voltage of one or more of the plurality of switching devices. For example, in an embodiment, as shown in FIG. 6, the method 300 may include measuring, via at least one voltage sensor 350, the gate-emitter voltage $V_{GE}$ of the one or more of the plurality of switching devices. Thus, as shown in FIG. 6, an example location of the voltage sensor 350 measuring the gate-emitter voltage $V_{GE}$ of an example IGBT is illustrated. More specifically, as shown, the IGBT is a three terminal, transconductance switching device having a collector, an emitter, and a gate as labeled. Further, as shown, the collector and emitter are associated with the conductance path which passes current, while the gate terminal controls the device. Thus, the IGBT can be turned ON or OFF by activating and deactivating the gate terminal. In particular, applying a positive input voltage signal across the gate and emitter will keep the device in its ON state, while making the input gate signal zero or slightly negative will cause it to turn OFF. Thus, the gate-emitter voltage $V_{GE}$ simply refers to the voltage from the gate to the emitter, whereas the collector-emitter voltage $V_{CE}$ simply refers to the voltage from the collector to the emitter.

Referring back to FIG. 5, as shown at (306), the method 300 includes comparing, via at least one comparator of the controller, the gate-emitter voltage $V_{GE}$ of the one or more plurality of switching devices to a reference voltage range corresponding to the commanded state from the one or more of the plurality of switching devices. In certain embodiments, the method 300 may also include implementing a time delay after receiving the commanded state from one or more of the plurality of switching devices and before comparing the gate-emitter voltage to the reference voltage range as it will take some time for the gate-emitter voltage to change to the commanded voltage. Moreover, in an embodiment, comparing the gate-emitter voltage $V_{GE}$ of one or more of the plurality of switching devices to the reference voltage range corresponding to the commanded state of the one or more plurality of switching devices may include comparing the gate-emitter voltage $V_{GE}$ of the one or more plurality of switching devices to each of an ON reference voltage range corresponding to the ON state or an OFF reference voltage range corresponding to the OFF state via, at least, first and second comparators.

Figure 7:
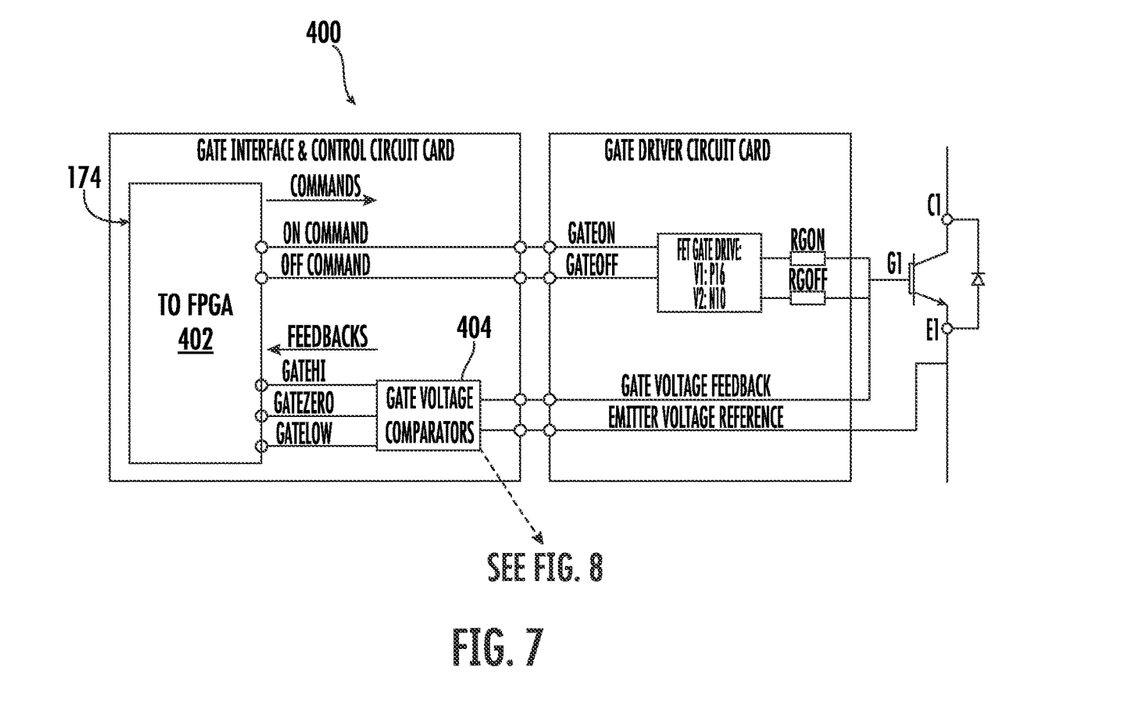
FIG. 7 illustrates a schematic diagram of an embodiment of a gate drive and control circuitry of a single-phase main circuit of a power converter according to the present disclosure.
Figure 8:
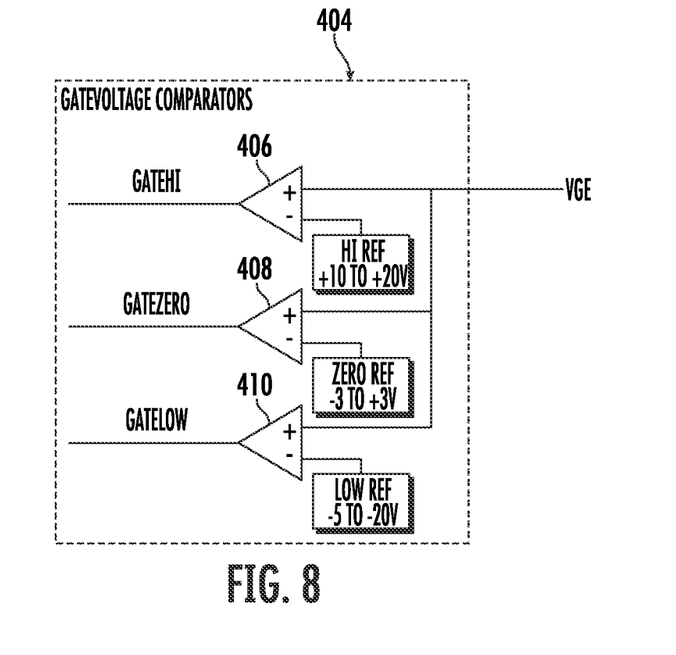
FIG. 8 illustrates a schematic diagram of an embodiment of a plurality of gate voltage comparators of the gate drive and control circuitry of the single-phase main circuit of the power converter of FIG. 7.

In particular, the present disclosure can be better understood with reference to FIGS. 7 and 8. More specifically, as shown in FIG. 7, a schematic diagram of an embodiment of a gate drive and control circuitry 400 of a single-phase main circuit of the power converter 162 according to the present disclosure is illustrated. Further, FIG. 8 illustrates a schematic diagram of an embodiment of a plurality of gate voltage comparators of the gate drive and control circuitry 400 of the single-phase main circuit of the power converter of FIG. 7.

In particular, as shown, the gate drive and control circuitry 400 communicates with the Field Programmable Gate Array (FPGA) 402, which may be part of the converter controller 174, as an example. Moreover, as shown, the gate drive and control circuitry 400 may include various gate voltage comparators 404 in communication with each of the IGBTs of the power converter 162. For example, as shown in FIG. 8, each of the switching devices may include three comparators in communication therewith. In particular, the comparators may include an ON comparator 406, a FAULT comparator 408, and an OFF comparator 410. Thus, as shown, each of the comparators 406, 408, 410 receives the gate-emitter voltage $V_{GE}$ and compares the gate-emitter voltage $V_{GE}$ to a reference voltage range corresponding to the commanded state of the one or more plurality of switching devices. More specifically, the ON comparator 406 receives the gate-emitter voltage $V_{GE}$ and compares the gate-emitter voltage $V_{GE}$ to an ON reference voltage range corresponding to the ON state. Similarly, the OFF comparator 410 receives the gate-emitter voltage $V_{GE}$ and compares the gate-emitter voltage $V_{GE}$ to an OFF reference voltage range corresponding to the OFF state. Further, the OFF comparator 408 receives the gate-emitter voltage $V_{GE}$ and compares the gate-emitter voltage $V_{GE}$ to a FAULT reference voltage range corresponding to a FAULT state (i.e., IGBT is shorted or faulty).

In certain embodiments, for example, the ON reference voltage range may include voltages ranging between about +10 volts (V) and about +20 V. In another embodiment, the OFF reference voltage range may include voltages ranging between about −5V to about −20V. Moreover, in an embodiment, a FAULT reference voltage range may include voltages ranging between about −3V to about +3V.

Figure 9:
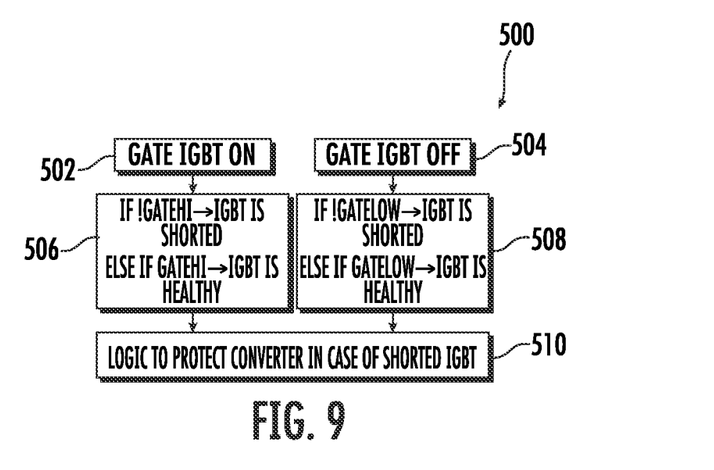
FIG. 9 illustrates a schematic diagram of an embodiment of protective logic implemented by a controller for operating a multi-level bridge power converter of an electrical power system connected to a power grid according to the present disclosure.

Referring back to FIG. 5, as shown at (308), the method 300 includes determining, via the controller, an actual state of the switching device(s) based on the comparison. For example, in an embodiment, as shown in FIG. 9, a schematic diagram of an embodiment of protective logic 500 that may be implemented by a controller, such as the converter controller 174, for operating the multi-level bridge power converter 162 to detect switching device failure according to the present disclosure is illustrated. In particular, the FPGA 402 of the converter controller 174 is configured to receive the commanded state of the switching device(s), i.e., Gate IGBT ON 502 or Gate IGBT OFF 504. Then, as shown at 506 and 508, the protective logic 500 is configured to determine the actual state of the switching device(s) based on the comparison of the gate-emitter voltage $V_{GE}$ and the respective reference voltage ranges.

In particular, if the commanded state of the switching device(s) is the ON state, the method 300 may include determining whether an output of the first comparator (e.g., the ON comparator 406) is within the ON reference voltage range. If so, then the actual state of the switching device(s) is determined to be the ON state. Moreover, if the commanded state of the switching device(s) is the OFF state, the method 300 may include determining whether an output of the second comparator (e.g., the OFF comparator 410) is within the OFF reference voltage range. If so, then the actual state of the switching device(s) is determined to be the OFF state. Further, if the commanded state of the switching device(s) is the ON state or the OFF state, the method 300 may include determining whether an output of a third comparator (e.g., the FAULT comparator 408) is within a FAULT reference voltage range. If so, then the actual state of the switching device(s) is determined to be a FAULT state.

Referring back to FIG. 5, as shown at (310), the method 300 further includes implementing, via the controller, a control action based on the actual state of the plurality of switching devices. For example, in an embodiment, as shown at 510 of FIG. 9, logic to protect the power converter 162 may be implemented in case of the shortened IGBT. More specifically, in an embodiment, the control action may include shutting down the multi-level bridge power converter 162 of the electrical power system to limit damage to a single-phase leg of the multi-level bridge power converter 162.

Further aspects of the disclosure are provided by the subject matter of the following clauses:

1. A controller-implemented method for operating a multi-level bridge power converter of an electrical power system connected to a power grid, the multi-level power converter having a first converter coupled to a DC link, the multi-level power converter having a plurality of switching devices, the method comprising:
receiving, via a controller, a commanded state for one or more of the plurality of switching devices;
receiving, via the controller, a gate-emitter voltage of the one or more of the plurality of switching devices;
comparing, via at least one comparator of the controller, the gate-emitter voltage of the one or more plurality of switching devices to a reference voltage range corresponding to the commanded state from the one or more of the plurality of switching devices;
determining, via the controller, an actual state of the one or more of the plurality of switching devices based on the comparison; and
implementing, via the controller, a control action based on the actual state of the one or more of the plurality of switching devices.

2. The method of clause 1, wherein the commanded state is one of an ON state or an OFF state.

3. The method of clause 2, wherein comparing the gate-emitter voltage of one or more of the plurality of switching devices to the reference voltage range corresponding to the commanded state of the one or more plurality of switching devices further comprises:
comparing the gate-emitter voltage of the one or more plurality of switching devices to each of an ON reference voltage range corresponding to the ON state or an OFF reference voltage range corresponding to the OFF state via, at least, first and second comparators.

4. The method of clause 3, wherein determining the actual state of the one or more plurality of switching devices based on the comparison further comprises:
if the commanded state of the one or more plurality of switching devices is the ON state, determining whether an output of the first comparator is within the ON reference voltage range and if so, then determining that the actual state of the one or more of the plurality of switching devices is the ON state.

5. The method of clauses 3 or 4, wherein determining the actual state of the one or more plurality of switching devices based on the comparison further comprises:
if the commanded state of the one or more plurality of switching devices is the OFF state, determining whether an output of the second comparator is within the OFF reference voltage range and if so, then determining that the actual state of the one or more of the plurality of switching devices is the OFF state.

6. The method of clauses 3-5, wherein determining the actual state of the one or more plurality of switching devices based on the comparison further comprises:
if the commanded state of the one or more plurality of switching devices is one of the ON state or the OFF state, determining whether an output of a third comparator is within a FAULT reference voltage range and if so, then determining that the actual state of the one or more of the plurality of switching devices is a FAULT state.

7. The method of clauses 3-6, wherein the ON reference voltage range comprises voltages ranging between about +10 volts (V) and about +20 V.

8. The method of clauses 3-7, wherein the OFF reference voltage range comprises voltages ranging between about −5V to about −20V.

9. The method of clauses 3-8, wherein a FAULT reference voltage range comprises voltages ranging between about −3V to about +3V.

10. The method of any of the preceding clauses, further comprising implementing a time delay after receiving the commanded state from one or more of the plurality of switching devices and before comparing the gate-emitter voltage of the one or more plurality of switching devices to a reference voltage range corresponding to the commanded state from the one or more of the plurality of switching devices.

11. The method of any of the preceding clauses, wherein implementing the control action based on the actual state of the one or more of the plurality of switching devices further comprises:
shutting down the multi-level bridge power converter of the electrical power system in order to limit damage to a single phase leg of the multi-level bridge power converter.

12. The method of any of the preceding clauses, further comprising measuring, via at least one voltage sensor, the gate-emitter voltage of the one or more of the plurality of switching devices.

13. The method of any of the preceding clauses, wherein the plurality of switching devices are insulated gate bipolar transistors (IGBTs).

14. The method of any of the preceding clauses, wherein the electrical power system is a wind turbine power system.

15. A multi-level bridge power converter with a plurality of phase legs, comprising:
a first converter and a second converter coupled together via a DC link, each of the first and second converters comprising a plurality of switching devices; and
a controller configured to operate the first and second converters, the controller comprising at least one processor, the at least one processor configured to perform a plurality of operations, the plurality of operations comprising:
receiving a commanded state for one or more of the plurality of switching devices;
receiving a gate-emitter voltage of the one or more of the plurality of switching devices;
comparing, via at least one comparator of the controller, the gate-emitter voltage of the one or more plurality of switching devices to a reference voltage range corresponding to the commanded state from the one or more of the plurality of switching devices;
determining an actual state of the one or more of the plurality of switching devices based on the comparison; and implementing a control action based on the actual state of the one or more of the plurality of switching devices.

16. The multi-level bridge power converter of clause 15, wherein the commanded state is one of an ON state or an OFF state, and wherein comparing the gate-emitter voltage of one or more of the plurality of switching devices to the reference voltage range corresponding to the commanded state of the one or more plurality of switching devices further comprises:
comparing the gate-emitter voltage of the one or more plurality of switching devices to each of an ON reference voltage range corresponding to the ON state or an OFF reference voltage range corresponding to the OFF state via, at least, first and second comparators.

17. The multi-level bridge power converter of clause 16, wherein determining the actual state of the one or more plurality of switching devices based on the comparison further comprises:
if the commanded state of the one or more plurality of switching devices is the ON state, determining whether an output of the first comparator is within the ON reference voltage range and if so, then determining that the actual state of the one or more of the plurality of switching devices is the ON state.

18. The multi-level bridge power converter of clause 17, wherein determining the actual state of the one or more plurality of switching devices based on the comparison further comprises:
if the commanded state of the one or more plurality of switching devices is the OFF state, determining whether an output of the second comparator is within the OFF reference voltage range and if so, then determining that the actual state of the one or more of the plurality of switching devices is the OFF state.

19. The multi-level bridge power converter of clauses 17 or 18, wherein determining the actual state of the one or more plurality of switching devices based on the comparison further comprises:
if the commanded state of the one or more plurality of switching devices is one of the ON state or the OFF state, determining whether an output of a third comparator is within a FAULT reference voltage range and if so, then determining that the actual state of the one or more of the plurality of switching devices is a FAULT state.

20. The multi-level bridge power converter of clauses 15-19, wherein implementing the control action based on the actual state of the one or more of the plurality of switching devices further comprises:
shutting down the multi-level bridge power converter of the electrical power system in order to limit damage to a single phase leg of the multi-level bridge power converter.

This written description uses examples to disclose the disclosure, including the best mode, and to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A controller-implemented method for operating a multi-level bridge power converter of an electrical power system connected to a power grid, the multi-level power converter having a first converter coupled to a DC link, the multi-level power converter having a plurality of switching devices, the method comprising:
receiving, via a controller, a commanded state for a gate of one or more of the plurality of switching devices;
receiving, via the controller, a gate-emitter voltage of the one or more of the plurality of switching devices, the gate-emitter voltage referring to a voltage from the gate to an emitter of the one or more of the plurality of switching devices;
comparing, via at least one comparator of the controller, the gate-emitter voltage of the one or more plurality of switching devices to a reference voltage range corresponding to the commanded state for the gate of the one or more of the plurality of switching devices;
determining, via the controller, an actual state of the gate of the one or more of the plurality of switching devices based on the comparison; and
implementing, via the controller, a control action based on the actual state of the gate of the one or more of the plurality of switching devices.

2. The method of claim 1, wherein the commanded state is one of an ON state or an OFF state of the gate.

3. The method of claim 2, wherein comparing the gate-emitter voltage of one or more of the plurality of switching devices to the reference voltage range corresponding to the commanded state for the gate of the one or more plurality of switching devices further comprises:
comparing the gate-emitter voltage of the one or more plurality of switching devices to each of an ON reference voltage range corresponding to the ON state or an OFF reference voltage range corresponding to the OFF state via, at least, first and second comparators.

4. The method of claim 3, wherein determining the actual state of the gate of the one or more plurality of switching devices based on the comparison further comprises:
if the commanded state for the gate of the one or more plurality of switching devices is the ON state, determining whether an output of the first comparator is within the ON reference voltage range and if so, then determining that the actual state of the gate of the one or more of the plurality of switching devices is the ON state.

5. The method of claim 3, wherein determining the actual state of the gate of the one or more plurality of switching devices based on the comparison further comprises:
if the commanded state of the gate of the one or more plurality of switching devices is the OFF state, determining whether an output of the second comparator is within the OFF reference voltage range and if so, then determining that the actual state of the gate of the one or more of the plurality of switching devices is the OFF state.

6. The method of claim 3, wherein determining the actual state of the gate of the one or more plurality of switching devices based on the comparison further comprises:
if the commanded state of the gate of the one or more plurality of switching devices is one of the ON state or the OFF state, determining whether an output of a third comparator is within a FAULT reference voltage range and if so, then determining that the actual state of the gate of the one or more of the plurality of switching devices is a FAULT state.

7. The method of claim 3, wherein the ON reference voltage range comprises voltages ranging between about +10 volts (V) and about +20 V.

8. The method of claim 3, wherein the OFF reference voltage range comprises voltages ranging between about −5V to about −20V.

9. The method of claim 3, wherein a FAULT reference voltage range comprises voltages ranging between about −3V to about +3V.

10. The method of claim 1, further comprising implementing a time delay after receiving the commanded state for the gate of the one or more of the plurality of switching devices and before comparing the gate-emitter voltage of the one or more plurality of switching devices to a reference voltage range corresponding to the commanded state for the gate of the one or more of the plurality of switching devices.

11. The method of claim 1, wherein implementing the control action based on the actual state of the gate of the one or more of the plurality of switching devices further comprises:
shutting down the multi-level bridge power converter of the electrical power system in order to limit damage to a single phase leg of the multi-level bridge power converter.

12. The method of claim 1, further comprising measuring, via at least one voltage sensor, the gate-emitter voltage of the one or more of the plurality of switching devices.

13. The method of claim 1, wherein the plurality of switching devices are insulated gate bipolar transistors (IGBTs).

14. The method of claim 1, wherein the electrical power system is a wind turbine power system.

15. A multi-level bridge power converter with a plurality of phase legs, comprising:
a first converter and a second converter coupled together via a DC link, each of the first and second converters comprising a plurality of switching devices; and
a controller configured to operate the first and second converters, the controller comprising at least one processor, the at least one processor configured to perform a plurality of operations, the plurality of operations comprising:
receiving a commanded state for a gate of one or more of the plurality of switching devices;
receiving a gate-emitter voltage of the one or more of the plurality of switching devices, the gate-emitter voltage referring to a voltage from the gate to an emitter of the one or more of the plurality of switching devices;
comparing, via at least one comparator of the controller, the gate-emitter voltage of the one or more plurality of switching devices to a reference voltage range corresponding to the commanded state for the gate of the one or more of the plurality of switching devices;
determining an actual state of the gate of the one or more of the plurality of switching devices based on the comparison; and
implementing a control action based on the actual state of the gate of the one or more of the plurality of switching devices.

16. The multi-level bridge power converter of claim 15, wherein the commanded state is one of an ON state or an OFF state, and wherein comparing the gate-emitter voltage of one or more of the plurality of switching devices to the reference voltage range corresponding to the commanded state of the gate of the one or more plurality of switching devices further comprises:
comparing the gate-emitter voltage of the one or more plurality of switching devices to each of an ON reference voltage range corresponding to the ON state or an OFF reference voltage range corresponding to the OFF state via, at least, first and second comparators.

17. The multi-level bridge power converter of claim 16, wherein determining the actual state of the gate of the one or more plurality of switching devices based on the comparison further comprises:
if the commanded state of the gate of the one or more plurality of switching devices is the ON state, determining whether an output of the first comparator is within the ON reference voltage range and if so, then determining that the actual state of the gate of the one or more of the plurality of switching devices is the ON state.

18. The multi-level bridge power converter of claim 17, wherein determining the actual state of the gate of the one or more plurality of switching devices based on the comparison further comprises:
if the commanded state of the gate of the one or more plurality of switching devices is the OFF state, determining whether an output of the second comparator is within the OFF reference voltage range and if so, then determining that the actual state of the gate of the one or more of the plurality of switching devices is the OFF state.

19. The multi-level bridge power converter of claim 17, wherein determining the actual state of the gate of the one or more plurality of switching devices based on the comparison further comprises:
if the commanded state of the gate of the one or more plurality of switching devices is one of the ON state or the OFF state, determining whether an output of a third comparator is within a FAULT reference voltage range and if so, then determining that the actual state of the gate of the one or more of the plurality of switching devices is a FAULT state.

20. The multi-level bridge power converter of claim 15, wherein implementing the control action based on the actual state of the gate of the one or more of the plurality of switching devices further comprises:
shutting down the multi-level bridge power converter of the electrical power system in order to limit damage to a single phase leg of the multi-level bridge power converter.

\* \* \* \* \*